United States Patent [19]

Zhang et al.

[11] Patent Number: 6,127,286
[45] Date of Patent: Oct. 3, 2000

[54] APPARATUS AND PROCESS FOR DEPOSITION OF THIN FILM ON SEMICONDUCTOR SUBSTRATE WHILE INHIBITING PARTICLE FORMATION AND DEPOSITION

[75] Inventors: Kaijun Leo Zhang, San Jose; Wilbur C. Catabay, Saratoga; Ming-Yi Lee, Fremont, all of Calif.

[73] Assignee: LSI Logic Corporation, Milpitas, Calif.

[21] Appl. No.: 09/076,502

[22] Filed: May 11, 1998

[51] Int. Cl.<sup>7</sup> .......................... H01L 21/31; H01L 21/469
[52] U.S. Cl. ............................................ 438/790; 438/909
[58] Field of Search ................................. 438/680, 787, 438/778, 905, 789, 790, 909

[56] References Cited

U.S. PATENT DOCUMENTS 5,462,899  10/1995  Ikeda ......................................... 437/238

Primary Examiner—David Nelms
Assistant Examiner—Bradley Smith
Attorney, Agent, or Firm—John P. Taylor

[57] ABSTRACT

Gaseous reactants capable of depositing a thin film on a semiconductor substrate are introduced into a deposition zone of a deposition apparatus through a gaseous reactants dispersion apparatus having rounded corners and smoothed anodized surfaces and maintained at a temperature ranging from about 70° C. to about 85° C., and preferably from about 75° C. to about 80° C., to inhibit the deposition and accumulation on such surfaces of charged materials capable of generating particles which may cause damage to the semiconductor substrate.

17 Claims, 3 Drawing Sheets

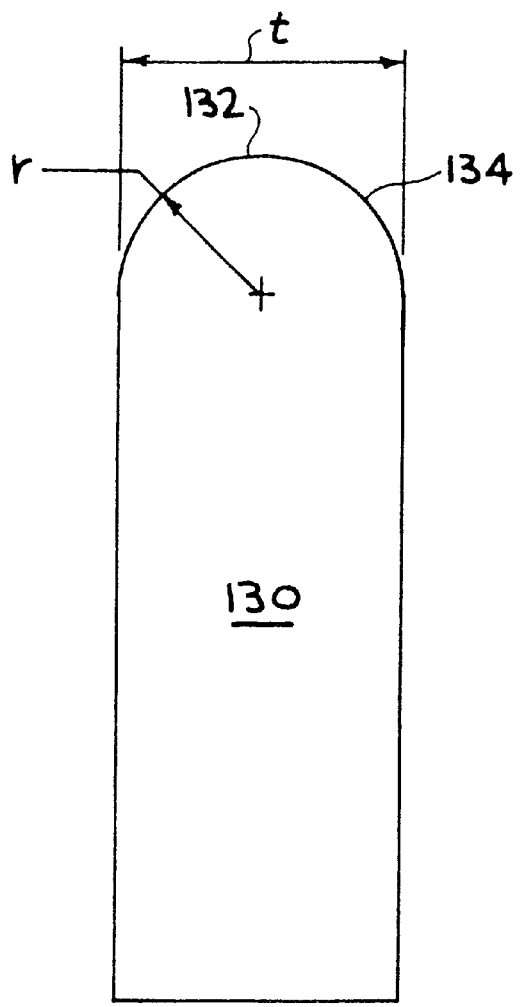 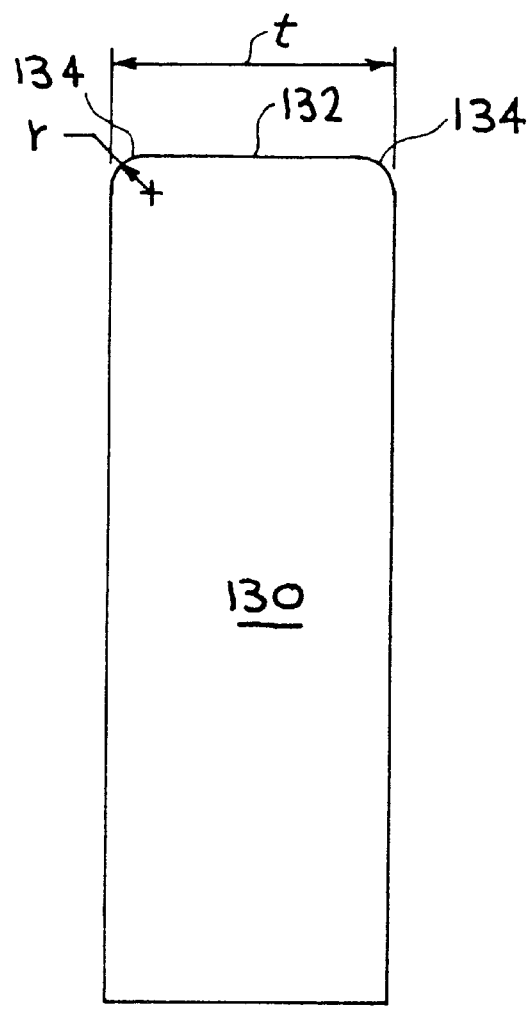
FIG. 5A   FIG. 5B
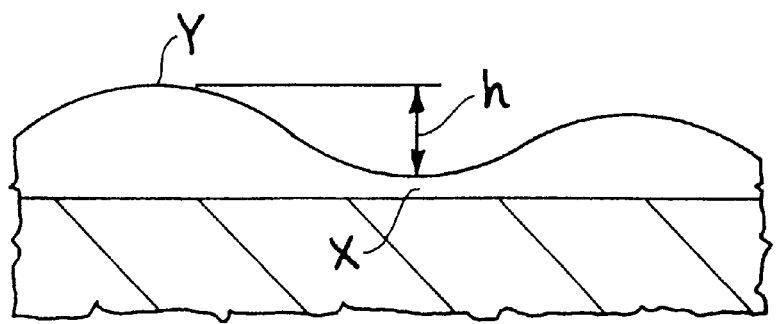
FIG. 6

APPARATUS AND PROCESS FOR DEPOSITION OF THIN FILM ON SEMICONDUCTOR SUBSTRATE WHILE INHIBITING PARTICLE FORMATION AND DEPOSITION

BACKGROUND OF THE INVENTION

1. Field of the Invention

This invention relates to the formation of integrated circuit structures on semiconductor substrates. More particularly, this invention relates to the formation of a thin film of material on a semiconductor substrate while inhibiting the formation and deposition of undesirable particles on the substrate.

2. Description of the Related Art

In the formation of thin films by deposition on semiconductor substrates, the gaseous reactants used for depositing the thin films are introduced into a deposition zone adjacent the substrate surface through a deposition apparatus designed to evenly introduce the materials across the surface area of the substrate. This is usually carried out by the use of a gaseous reactants dispersion apparatus having multiple openings through which the gas flows toward the substrate surface. Often the deposition involves the reaction of two or more gases which may be mixed together prior to introduction of the gases into the deposition zone, or the gases may be kept separate from one another until they are introduced, through separate outlets, into the deposition zone where they then react together.

Such depositions are sometimes carried out in the presence of a plasma and the resulting charged ions are attracted to a grounded or electrically biased substrate. In other instances, no plasma is used and there is no electrical bias on the substrate. However, even when there are no externally introduced electrical charges associated with the deposition, decomposition of the reactive gases and/or reaction between the gases or their decomposition products may occur before the materials reach the substrate surface, resulting in undesirable deposition or condensation of materials on the surfaces of the deposition apparatus, including the gas distribution apparatus. Furthermore, when such deposited materials are the reaction products of decomposed starting materials, they may carry a static charge, resulting in a charge buildup when such materials are deposited on non-conductive surfaces, i.e., dielectric surfaces. Such a buildup of charged materials on surfaces of the gaseous reactants dispersion apparatus adjacent the substrate can, in turn, result in periodic discharge of the accumulated charge, resulting in the release of particles from such dispersion apparatus surfaces. These particles, in turn, may deposit on the surface of the substrate, resulting in damage or destruction of the integrated circuit structure already constructed on the semiconductor substrate. Such deposition of undesirable and destructive particles on the semiconductor substrate is to be avoided at all costs.

The deposition of silicon dioxide ($SiO_2$) on a semiconductor substrate by reaction of an organic source of silicon such as TEOS (tetraethylorthosilicate) with a source of oxygen such as $O_3$, or a mixture of $O_3$ and $O_2$, is an example of a deposition which utilizes reactive gases which may result in the formation of undesirable charged materials or byproducts, including organic byproducts, which may deposit or condense on the surfaces of the dispersion apparatus. Such accumulation of charged materials on the surfaces of the gaseous reactants dispersion apparatus can, in turn, result in charge buildup and eventual electrical discharge causing the formation of undesirable particles which then deposit on the substrate surface.

FIGS. 1–3 depict a prior art deposition apparatus including a gaseous reactants dispersion apparatus, with the buildup of particle-generating charged deposits on such prior art gaseous reactants dispersion apparatus particularly shown in FIG. 3. Referring now to FIG. 1, a semiconductor substrate 10 is shown mounted on a substrate support or susceptor 14 suspended over such a gaseous reactants dispersion apparatus, generally indicated by arrow 20. Substrate 10 may be secured to susceptor 14 by vacuum ports therein (not shown) having openings on the surface of susceptor 14 facing substrate 10.

Gaseous reactants dispersion apparatus 20 comprises a series of flat anodized aluminum plates 30, having a thin coating 31 of aluminum oxide anodized on the surface of plate 30 to protect plate 30 from chemical attack by the reactants flowing gaseous reactants dispersion apparatus 20. Anodized plates 30 are mounted parallel to one another, in a mounting case or shell 40, facing substrate 10 to thereby define a series of passages 44 between plates 30 through which the gaseous reactants flow toward the facing surface of substrate 10. A cooling jacket 50 surrounds mounting case 40, with a coolant flowing therethrough to maintain the temperature in gaseous reactants dispersion apparatus 20 within a range of from about 55° C. to about 60° C.

As the gaseous reactants flow through and out of passageways 44 and past the ~90° corners 34 at the end edges 32 of flat plates 30, there is a tendency for some of the gaseous reactant materials to deposit adjacent such sharp corners 34 of end edges 32, as indicated by numeral 33 in prior art FIG. 3. This is particularly prevalent when the gaseous reactants comprise organic materials such as the TEOS source of silicon used in the deposition of $SiO_2$ on substrate 10. Such deposits, as previously discussed, can be the result of decomposition of the reactants and/or the result of condensation of vaporized liquids, particularly at the temperature of 55–60° C. characteristically used in the prior art during the deposition. As indicated in FIG. 3, these deposits include charged ions and/or particles which leads to a buildup of charge on the anodized (insulative) surface 31 of each aluminum plate 30, resulting in eventual sudden discharge of the accumulated charge and deleterious scattering of particles from deposits 33 over the surface of substrate 10.

It would, therefore, be desirable to provide a process and apparatus for depositing a thin film on a semiconductor substrate using gaseous reactants wherein the buildup of charged deposits on the gaseous reactants dispersion apparatus, and resultant production of undesirable particles, is inhibited.

SUMMARY OF THE INVENTION

In accordance with the invention, gaseous reactants capable of depositing a thin film on a semiconductor substrate are introduced into a deposition zone of a deposition apparatus through a gaseous reactants dispersion apparatus having rounded corners and smoothed surfaces and maintained at a temperature ranging from about 70° C. to about 85° C., and preferably from about 75° C. to about 80° C., to inhibit the deposition and accumulation on such surfaces of charged species capable of generating particles which cause damage to the semiconductor substrate.

BRIEF DESCRIPTION OF THE DRAWINGS

FIG. 5A is a fragmentary vertical cross-sectional view of a magnified portion of the gas dispersion apparatus shown in FIG. 4 to illustrate the maximum roundness of the corners of the plates of the gas dispersion apparatus of the invention.

FIG. 5B is a fragmentary vertical cross-sectional view of a magnified portion of the gas dispersion apparatus shown in FIG. 4 to illustrate the minimum roundness of the corners of the plates of the gas dispersion apparatus of the invention.

FIG. 6 is a cross-sectional view illustrating the degree of smoothness of the anodized surfaces of the gas dispersion apparatus of the invention.

DETAILED DESCRIPTION OF THE INVENTION

The invention comprises a process and apparatus, for use in the deposition of a thin film on a semiconductor substrate, to inhibit the deposition and accumulation, on surfaces of a gaseous reactants dispersion apparatus, of charged species capable of generating particles which damage the semiconductor substrate. To inhibit such particle generation, the gaseous reactants capable of depositing the thin film on the semiconductor substrate are introduced into a deposition zone through a gaseous reactants dispersion apparatus having rounded corners at the end edges thereof where the gaseous reactants emerge from the dispersion apparatus, and smoothed surfaces, and the gaseous reactants dispersion apparatus is maintained at a temperature sufficiently high to inhibit condensation of the gaseous reactants on the surface of the gaseous reactants dispersion apparatus.

By use of the term "gaseous reactants" is meant reactants capable of reacting together to form a thin film on a semiconductor substrate wherein the reactants are in a gaseous state either due to the use of reactants which are normally in a gaseous state at ambient conditions, or due to the previous vaporization of a liquid (or by sublimation of a solid) into a gaseous state. The term "gaseous reactants dispersion apparatus" is then intended to define apparatus for uniformly distributing such "gaseous reactants" (regardless of their previous state) across the surface of a semiconductor substrate in a deposition apparatus.

Figure 1:
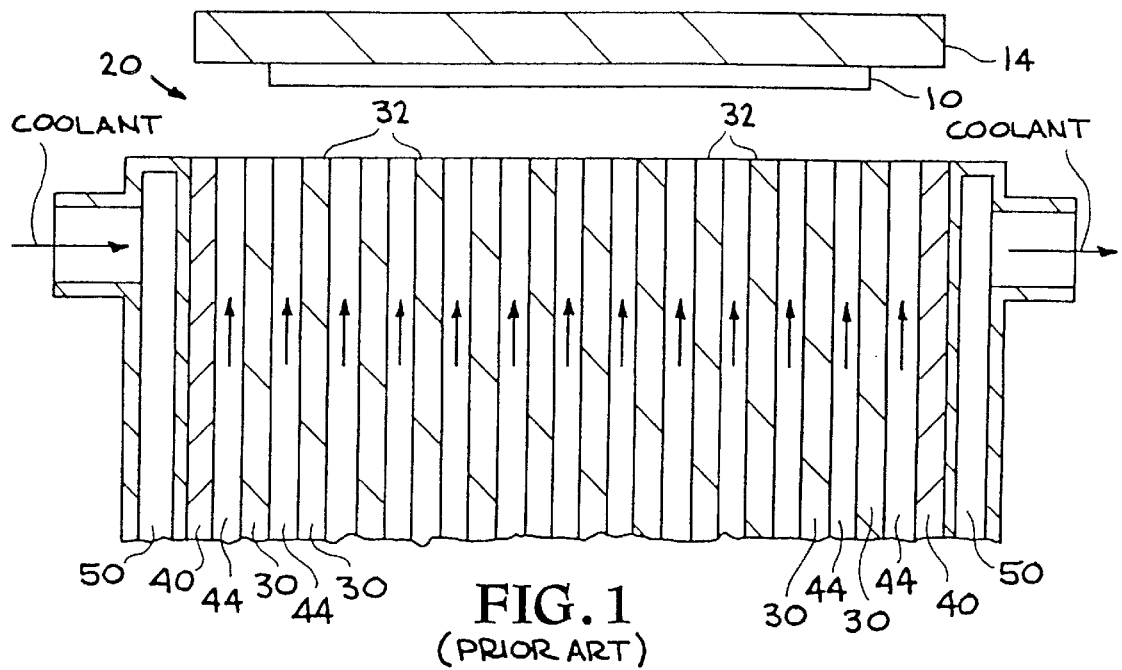
FIG. 1 is a fragmentary vertical cross-sectional view of a prior art deposition apparatus, showing a portion of the gas dispersion apparatus, including an end view of the aluminum plates.
Figure 2:
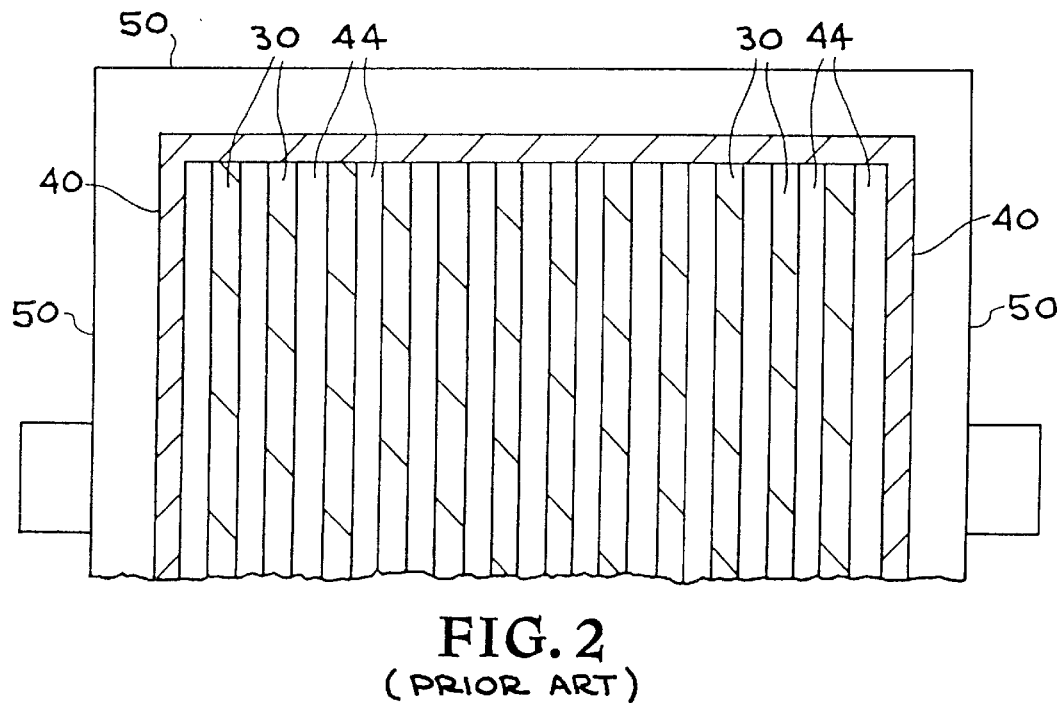
FIG. 2 is a fragmentary top view of the portion of the prior art gas dispersion apparatus shown in FIG. 1.
Figure 3:
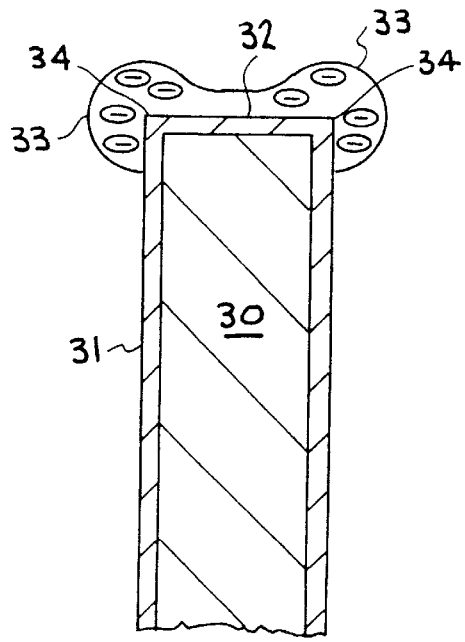
FIG. 3 is a fragmentary vertical cross-sectional view of a magnified portion of the prior art gas dispersion apparatus shown in FIG. 1 showing an end view of one of the aluminum plates and the accumulation of deposits on this plate adjacent its sharp corners at the end edge of the plate.
Figure 4:
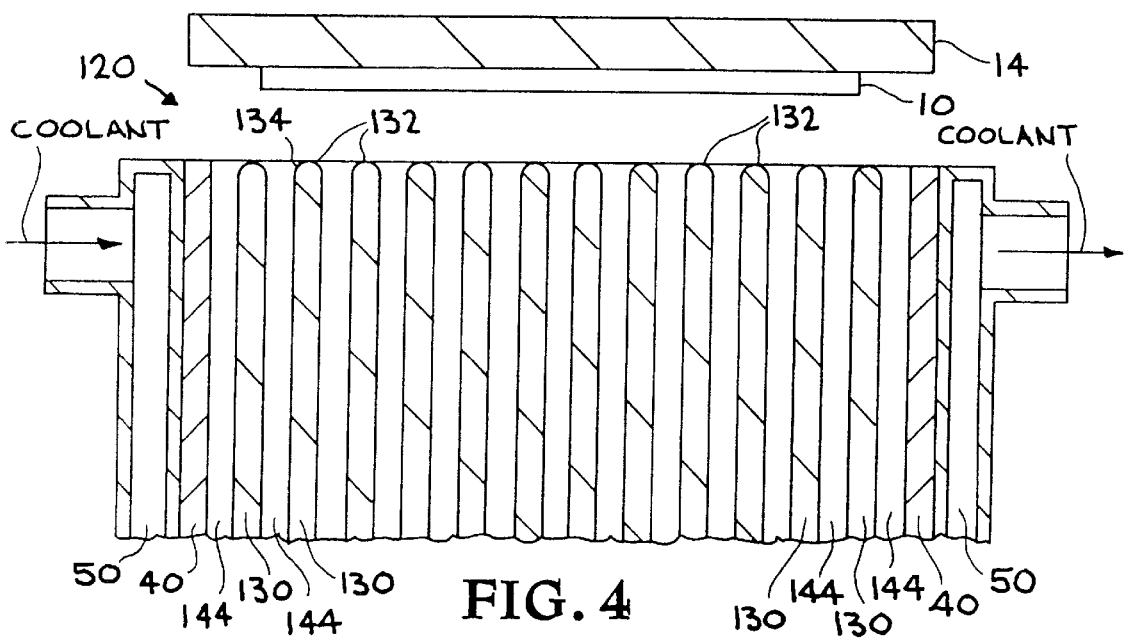
FIG. 4 is a fragmentary vertical cross-sectional view of the gas dispersion apparatus of the invention.

Turning to FIG. 4, a deposition apparatus is shown having a gaseous reactants dispersion apparatus 120 which has been modified in accordance with the invention from the prior art gaseous reactants dispersion apparatus 20 shown in FIG. 1. In the modified apparatus of FIG. 4, wherein like numerals will be used to describe like structure to that previously described for FIG. 1, a semiconductor substrate 10 is shown secured to a susceptor 14 and facing gaseous reactants dispersion apparatus 120. Anodized aluminum plates 130 are shown mounted parallel to one another within casing 40 to thereby define passageways 144 therebetween. As in the previously described structure, a coolant jacket 50 surrounds casing 40 to control the temperature of gaseous reactants dispersion apparatus 120. In accordance with the invention, end edges 132 of plates 130 are provided with rounded corners 134, replacing the sharp corners 34 of prior art plates 30 shown in FIG. 1.

As shown in more detail in FIGS. 5A and 5B, rounded corners 134 have a radius of curvature which may range from as large as ½ the thickness of the plate (i.e., a complete half circle commencing at one surface of the plate and ending at the other surface, with the diameter of the half circle equal to the thickness of the plate), as shown in FIG. 5A, to a radius of curvature as small as about 0.125 times the thickness of the plate, as illustrated in FIG. 5B. Preferably, the radius of curvature of the rounded corners of the plate will range from about 0.25 to 0.5 times the thickness of the plate. Providing such rounded corners 134 on plates 130 inhibits the formation of charged deposits of the gaseous reactants or their condensation or decomposition products on the corners of the anodized plates by eliminating nucleation sites, whereby subsequent particle formation and deposition on the substrates will be eliminated or at least reduced.

In accordance with another aspect of the invention, aluminum plates 130 are provided with a smoother anodized coating thereon to again reduce the buildup of charged deposits of the gaseous reactants or their condensation or decomposition products on the surfaces of the anodized plates by eliminating nucleation sites, whereby particle formation and deposition on the substrates will be eliminated or at least mitigated. The use of the term "smoother", with respect to the anodized coating, is meant to define a coating wherein the distance h between lowest (thinnest) region x of the anodized coating film on the surface of plate 130, and highest (thickest) region y of the anodized coating film on the surface of plate 130, as illustrated in FIG. 6, does not exceed about 0.3 micrometers ($\mu$m), and preferably does not exceed about 0.2 $\mu$m. This is in contrast to the conventional prior art smoothness of such anodized aluminum plates wherein the distance h between lowest (thinnest) regions on the surface and highest (thickest) regions on the surface may be as much as 1 $\mu$m or even larger. It should be noted that the above definition of smoothness, when applied to the rounded corners discussed above, would be measured as the difference between the radius of the curve intersecting the highest (thickest) region and the radius of the curve intersecting the lowest (thinnest) region of the surface.

Such smooth anodization may be achieved in one or more of a number of ways. First of all, to achieve a smoother surface of anodized material (aluminum oxide) on the surface of aluminum plate 130, the aluminum plate may be subjected to a polishing step to smooth the underlying aluminum surface to be anodized. Furthermore, it is customary to treat the aluminum plate in a caustic solution (e.g., sodium hydroxide), just prior to immersion of the plate in the anodizing bath, to remove any surface oxides which may have formed thereon which would interfere with the anodization process. To maintain a smoother surface on plate 130, this etch step should be carefully controlled to avoid excess etching of the plate in the caustic solution. During the anodization step itself, the voltage (which determines the thickness of the anodized coating) should be maintained, through a well regulated power supply, at a level sufficient to provide the desired thickness of aluminum oxide desired to protect the aluminum plate. During the anodization, the anodization voltage should be maintained with a range of from about 80 volts to about 120 volts, preferably from about 90 volts to about 110 volts, and most preferably between about 95 volts and about 105 volts. typically, the anodization voltage will be maintained at about 100 volts. The anodization will usually be carried out for a period of from about 100 minutes to about 140 minutes, typically about 120 minutes. When the current flow drops, indicating that the desired thickness of anodized aluminum oxide has formed on the aluminum plate, the plate should be promptly removed from the anodization bath and rinsed in water (preferably deionized water).

It is also believed to be preferable to anodize the aluminum in an organic acid bath to achieve a higher degree of smoothness of the anodized surface for any given set of anodization parameters. Particularly preferred organic acids useful in the formation of smooth anodized surfaces on the aluminum plate are dicarboxylic acid electrolytes having the formula $(CH_2)_n(COOH)_2$, where n ranges from 0 to 8. A particularly preferred dicarboxylic acid which may be used for anodization of the aluminum plate is oxalic acid, having the formula HOOCCOOH.

In accordance with another aspect of the invention, it has been discovered that the formation of charged deposits on the surfaces of the anodized plates, comprising the passageways through which the gaseous reactants flow, can also be reduced by operating the gaseous reactants dispersion apparatus at a higher temperature to reduce the amount of condensation of the gaseous reactants, and, in particular, the condensation of TEOS which comprises a vaporized liquid reactant. While the prior art operation of the conventional prior art gaseous reactants dispersion apparatus of FIG. 1 was at a temperature ranging between 55–60° C., we have discovered that condensation of the gaseous reactants on the anodized surfaces of the aluminum plates in the gaseous reactants dispersion apparatus may be markedly reduced, by maintaining the gaseous reactants dispersion apparatus within a temperature ranging from about 70° C. to about 90° C., and preferably from about 75° C. to about 80° C. When the gaseous reactants dispersion apparatus is maintained within the latter preferred temperature range, particle production caused by deposition and/or condensation on the anodized surfaces of the aluminum plates may be reduced by as much as 20%.

The temperature of the gaseous reactants dispersion apparatus may be maintained within the specified temperature range of from about 70° C. to about 90° C., or within the preferred range of from about 75° C. to about 80° C., by regulating the amount of coolant flowing through the cooling jacket 50, e.g., by using a thermostat regulating the coolant flow, or by any other convenient means for maintaining the temperature of the dispersion apparatus within the desired temperature range.

To further illustrate the invention, a silicon oxide layer was conventionally deposited, by prior art processing, on the surface of a conventional six inch diameter single crystal silicon wafer, using a QTI 5800 deposition apparatus available from Questar Technology, Inc. with a QTI 5850/4800 dispersion head. While maintaining the dispersion head at the factory set temperature of 55–60° C., 25 standard liters per minute (slm) of vaporized tetraethylorthosilicate (TEOS) and an $O_3/O_2$ mixture of 80 grams/cm$^3$ $O_3$ and 37.5 slm $O_2$ (i.e., a ratio of 65–70% by volume $O_3$ and 30–35% by volume $O_2$) were flowed through the QTI 5850/4800 dispersion head toward the surface of the wafer. The deposition was carried out for 5–10 minutes. The flow of gases was then shut off and the silicon wafer was then removed from the susceptor. The $SiO_2$-coated surface was then examined using a Tencor 6420 particle scan tool and found to have particles on the surface. Particles could also be seen on the $SiO_2$ surface by UV light.

In contrast another six inch diameter single crystal silicon wafer may be processed to form a $SiO_2$ coating thereon, but in accordance with the invention. The end edges of each of the 3 millimeter (mm) thick aluminum plates in the QTI 5850/4800 dispersion head of the deposition apparatus can be rounded off to provide a continuous rounded edge from the first surface of the plate to the opposite surface to have a radius of curvature of about 1.5 mm., i.e., a continuous curvature from one surface to the other. The aluminum plates may be polished, then etched to remove surface oxides, and then anodized in an oxalic acid electrolyte at ambient temperature for about 120 minutes at an anodizing voltage of about 100 volts. The plates would then be removed from the anodization bath and rinsed in deionized water. The resultant porous coating of aluminum oxide may then be sealed to reduce the porosity by immersion in a boiling water solution containing cobalt acetate salts (as is well known to those skilled in the art), and then dried and reassembled into the QTI 5850/4800 dispersion head. The same mixture of TEOS and oxygen-containing gases as previously described may then be flowed through the dispersion head to the surface of the wafer under the same conditions as described above to form the desired $SiO_2$ coating on the silicon wafer. When a silicon wafer so coated in accordance with the invention is then removed from the susceptor and examined for the presence of particles on the $SiO_2$-coated surface in the same manner as before, substantially no particles should be found on the surface of the wafer.

The invention provides a procedure for forming a thin film, such as an $SiO_2$ film on the surface of a semiconductor substrate in a manner which will eliminate or at least materially reduce the incidence of particle generation and deposition on the substrate as a result of buildup of deposits on the gaseous reactants dispersion apparatus used to deliver the gaseous reactants to the surface of the substrate.

Having thus described the invention what is claimed is:

1. A process for depositing a thin film on a semiconductor substrate which comprises introducing gaseous reactants capable of depositing said thin film into a deposition zone of a deposition apparatus through a gaseous reactants dispersion apparatus having rounded corners and smoothed surfaces while maintaining said gaseous reactants dispersion apparatus at a temperature sufficiently high to inhibit condensation of the gaseous reactants on the surface of the gaseous reactants dispersion apparatus.

2. The process of claim 1 wherein said gaseous reactants dispersion apparatus is maintained at a temperature ranging from about 70° C. to about 85° C. during said deposition process.

3. The process of claim 1 wherein said rounded corners in said gaseous reactants dispersion apparatus are located on the end edges of plates within said gaseous reactants dispersion apparatus defining the walls of passageways through which said gaseous reactants flow in said gaseous reactants dispersion apparatus.

4. The process of claim 3 wherein said rounded corners in said gaseous reactants dispersion apparatus are located on the end edges of said plates at the ends of said passageways from which said gaseous reactant flow toward said semiconductor substrate.

5. The process of claim 3 wherein said rounded corners in said gaseous reactants dispersion apparatus on the end edges of said plates have a radius ranging from about 0.125 to about 0.5 times the thickness of said plates.

6. The process of claim 1 wherein said smoothed surfaces of said gaseous reactants dispersion apparatus have a surface variation of not more than 0.3 μm from the highest point on said surface to the lowest point.

7. The process of claim 1 wherein said smoothed surfaces of said gaseous reactants dispersion apparatus have a surface variation of not more than 0.2 μm from the highest point on said surface to the lowest point.

8. A process for depositing a thin film of SiO$_2$ on a semiconductor substrate which comprises introducing reactants, comprising gaseous tetraethylorthosilicate (TEOS) and an oxygen-containing gas capable of reacting with said TEOS to deposit said thin film of SiO$_2$, into a deposition zone of a deposition apparatus through a gaseous reactants dispersion apparatus having rounded corners and smoothed surfaces while maintaining said gaseous reactants dispersion apparatus at a temperature ranging from about 70° C. to about 85° C. to inhibit the deposition and accumulation on said surfaces of said gaseous reactants dispersion apparatus of charged materials from said reactants capable of generating particles which may damage said semiconductor substrate.

9. The process of claim 8 wherein said oxygen-containing gas includes a component selected from the group consisting of O$_3$, O$_2$, and mixtures thereof.

10. The process of claim 8 wherein said gaseous reactants dispersion apparatus is maintained at a temperature ranging from about 75° C. to about 80° C. during said deposition process.

11. The process of claim 8 wherein said rounded corners in said gaseous reactants dispersion apparatus are located on the end edges of plates within said gaseous reactants dispersion apparatus defining the walls of passageways through which said gaseous reactants flow in said gaseous reactants dispersion apparatus.

12. The process of claim 8 wherein said rounded corners in said gaseous reactants dispersion apparatus on the end edges of said plates have a radius ranging from about 0.125 to about 0.5 times the thickness of said plates.

13. The process of claim 8 wherein said smoothed surfaces of said gaseous reactants dispersion apparatus have a surface variation of not more than 0.3 μm from the highest point on said surface to the lowest point.

14. The process of claim 8 wherein said smoothed surfaces of said gaseous reactants dispersion apparatus have a surface variation of not more than 0.2 μm from the highest point on said surface to the lowest point.

15. A process for depositing a thin film of SiO$_2$ on a semiconductor substrate which comprises introducing reactants, comprising gaseous tetraethylorthosilicate (TEOS) and an oxygen-containing gas including a component selected from the group consisting of O$_3$, O$_2$, and mixtures thereof and capable of reacting with said TEOS to deposit said thin film of SiO$_2$, into a deposition zone of a deposition apparatus through a gaseous reactants dispersion apparatus having rounded corners located on the end edges of plates within said gaseous reactants dispersion apparatus defining the walls of passageways through which said gaseous reactants flow in said gaseous reactants dispersion apparatus, said rounded corners having a radius ranging from about 0.125 to about 0.5 times the thickness of said plates, and smoothed surfaces defined as a surface variation of not more than 0.3 μm from the highest point on said surface to the lowest point, while maintaining said gaseous reactants dispersion apparatus at a temperature ranging from about 70° C. to about 85° C. to inhibit the deposition and accumulation on said surfaces of said gaseous reactants dispersion apparatus of charged species from said reactants capable of generating particles capable of damaging said semiconductor substrate.

16. The process of claim 15 wherein said smoothed surfaces of said gaseous reactants dispersion apparatus have a surface variation of not more than 0.2 μm from the highest point on said surface to the lowest point.

17. The process of claim 15 wherein said gaseous reactants dispersion apparatus is maintained at a temperature ranging from about 75° C. to about 80° C. during said deposition process.

* * * * *